United States Patent
Alsop

(10) Patent No.: US 7,545,142 B2
(45) Date of Patent: Jun. 9, 2009

(54) ARTERIAL SPIN LABELING WITH PULSED RADIO FREQUENCY SEQUENCES

(75) Inventor: David Alsop, Newton, MA (US)

(73) Assignee: Beth Israel Deaconess Medical Center, Inc., Boston, MA (US)

( * ) Notice: Subject to any disclaimer, the term of this patent is extended or adjusted under 35 U.S.C. 154(b) by 96 days.

(21) Appl. No.: 11/591,308

(22) Filed: Nov. 1, 2006

(65) Prior Publication Data

US 2007/0132452 A1 Jun. 14, 2007

Related U.S. Application Data

(60) Provisional application No. 60/732,178, filed on Nov. 1, 2005.

(51) Int. Cl.
*G01V 3/00* (2006.01)
(52) U.S. Cl. .................................... 324/306; 600/419
(58) Field of Classification Search ................ 324/306, 324/307; 600/419
See application file for complete search history.

(56) References Cited

U.S. PATENT DOCUMENTS

| | | | |
|---|---|---|---|
| 6,285,900 B1 * | 9/2001 | Stuber et al. | 600/410 |
| 6,564,080 B1 * | 5/2003 | Kimura | 600/410 |
| 6,717,405 B2 | 4/2004 | Alsop | |
| 2003/0193334 A1 * | 10/2003 | Alsop | 324/306 |

OTHER PUBLICATIONS

Haase, "Snapshot Flash MRI. Applications to T1, T2, and Chemical-Shift Imaging," *Magnetic Resonance in Medicine*, vol. 13, pp. 77-89 (1990).

* cited by examiner

*Primary Examiner*—Brij B. Shrivastav
*Assistant Examiner*—Megann E Vaughn
(74) *Attorney, Agent, or Firm*—Wolf, Greenfield & Sacks, P.C.

(57) ABSTRACT

In one aspect, a method for imaging fluid flow and/or perfusion using spin labeling is provided. The method comprises applying a first magnetic gradient sequence at least to a labeling region, applying a first pulsed radio frequency (RF) sequence to the labeling region to label the fluid, the first pulsed RF sequence comprising a first plurality of pulses wherein an amplitude envelope is non-zero, the first plurality of pulses each separated by a respective first plurality of intervals wherein the amplitude envelope is substantially zero, and acquiring at least one first signal emitted from an imaging region a predetermined delay after applying the first pulsed RF sequence.

20 Claims, 8 Drawing Sheets

ARTERIAL SPIN LABELING WITH PULSED RADIO FREQUENCY SEQUENCES

RELATED APPLICATIONS

This application claims priority under 35 U.S.C. §119(e) to U.S. Provisional Application Ser. No. 60/732,178, entitled "CONTINUOUS ARTERIAL SPIN LABELING WITH PULSED GRADIENT AND RADIOFREQUENCY FIELDS," filed on Nov. 1, 2005, which is herein incorporated by reference in its entirety.

FEDERALLY SPONSORED RESEARCH

This invention was made with Government support under National Institute of Health (NIH) grant number NIH R01 AG19599. The Government may have certain rights in this invention

FIELD OF THE INVENTION

The present application relates to a technique for imaging fluid flow noninvasively, and more particularly, to magnetic resonance imaging (MRI) using spin labeling techniques.

BACKGROUND OF THE INVENTION

Magnetic resonance imaging (MRI) is a technique used frequently in medical settings to produce images of the inside of the human body. MRI is based on detecting nuclear magnetic resonance (NMR) signals emitted by molecules under the influence of electro-magnetic fields. In particular, magnetic resonance (MR) techniques involve detecting electromagnetic changes resulting from re-alignment of atomic spin of molecules in the tissue of the human body. MR techniques may be used to study fluid flow, such as, for example, blood flow and/or blood perfusion in tissue. One of many possible applications is the study of blood perfusion in the human brain.

During an MRI procedure, NMR signals emitted from a volume of interest or from a slice (i.e., a relatively thin region) of the volume of interest are detected and/or otherwise obtained. The acquired NMR signals may then be reconstructed to form a two dimensional (2D) image of the slice. A plurality of such 2D images reconstructed from NMR signal data obtained from successive slices may be stacked together to form a three dimensional (3D) image. A 2D image is comprised of pixels, each pixel having an intensity (e.g., a magnitude or value) that is proportional to the strength of the NMR signal emitted by a corresponding location in the volume of interest. Similarly, a 3D image is composed of voxels, each voxel having an intensity proportional to the strength of the NMR signal emitted from a corresponding portion of the volume of interest.

As discussed above, MRI exploits the NMR phenomenon to distinguish various tissue characteristics. In particular, MRI operates by manipulating spin characteristics of tissue, and more specifically, hydrogen atoms of water molecules which compose a significant proportion of the human body, including both blood and tissue. MRI techniques include aligning the spin characteristics of hydrogen nuclei in a magnetic field, and perturbing the magnetic field with radio frequency (RF) signals.

The NMR phenomenon is invoked by the RF signals, applied at the Larmor frequency, exciting the hydrogen nuclei and causing the spin to briefly precess about an axis in the direction of the applied RF signal, rather than in the direction of the applied magnetic field. The Larmor frequency is related to the rate at which a nucleus precesses about an axis, which is, in turn, proportional to the strength of the applied magnetic field. When the RF signal subsides, the spins gradually realign with the magnetic field, releasing energy in the process. The released energy may be detected and used to form one or more images representative of the hydrogen content of the tissue. The NMR signals may be detected using one or more RF coils sensitive to electromagnetic changes caused by the NMR signals. The RF coils may be the same or different than RF coils, that when driven by a signal generator, provide the RF signals used to invoke the NMR phenomenon.

Using these fundamental principles, fluid content may be measured in a variety of substances or tissue, by measuring characteristics of the tissue's NMR response. In order to detect fluid flow or perfusion in a particular region of interest, fluid flowing into that region may be "labeled" by reversing, or perturbing, the spins of the protons of the fluid in some region that is "upstream" from the region of interest, and then detecting the labeled fluid when it flows through or is perfused into the region of interest. Although terms "flow" and "perfusion" may sometimes be used interchangeably, perfusion as used herein refers to a diffusible exchange between a fluid and a substance, such as, for example, human tissue. The term "flow" as used herein, generally refers to flow of liquid in vessels, such as, for example, flow of blood in arteries. The term "labeling" refers herein to preparing atomic spins such that, upon relaxation or recovery, a detectable NMR signal is produced.

One strategy for spin labeling includes providing RF signals that result in spin inversion for atoms exposed to the RF energy. The inversion recovery (i.e., the process of the atoms returning from the induced inverted spins) emits an NMR signal that can be detected to measure blood flow and/or perfusion. Spin inversion may be achieved by generally aligning the spins in a magnetic field, and inverting the spins by applying an RF field, typically, in a direction orthogonal to the magnetic field, as discussed above. A number of RF field waveforms, referred to herein as an RF sequence, that achieve spin inversion are generally known. However, conventional RF sequences have several drawbacks, as discussed in further detail below.

By applying a gradient magnetic field to align the spins, the spin inversion effect may be localized to a particular region of interest. In particular, to achieve spin inversion, the RF field is applied at an appropriate frequency (i.e., the Larmor frequency), which depends, at least in part, on the strength of the magnetic field. Thus, an RF field applied at a particular frequency will only induce spin inversion at portions of the gradient magnetic field where the RF frequency matches the Larmor frequency at the corresponding magnetic field strength. By appropriately selecting the gradient magnetic field and RF frequency, spin inversion effects may be spatially isolated such that only spins in a region of interest are labeled.

However, despite localization efforts, magnetization transfer effects and other unrelated errors may interfere with the labeling procedure by causing more than just the atoms in the region of interest to be labeled, which in turn results in artifacts in the reconstructed images. In order to account for such effects, a control procedure may be used wherein the magnetic field gradient and RF sequence are selected to mimic the unrelated effects without invoking spin inversion. MR images reconstructed from NMR data obtained after the labeling procedure and control procedure may be used to reduce or eliminate these unwanted effects, for example, by subtracting out the effects associated with one or more control images to remove at least some of the image artifacts from the labeling images.

MR techniques in general endeavor to achieve a balance between signal to noise ratio (SNR) and power deposition. In particular, the higher the energy of the magnetic fields used (and correspondingly the higher the energy of the RF sequences needed to invoke the NMR effect), the greater the SNR of the NMR signals. Accordingly, higher energy MR results in higher contrast, better quality images. However, performing MRI at higher energies results in increased RF power deposition. There are limits to the RF power that may be deposited in the human body without harming the tissue.

SUMMARY OF THE INVENTION

One embodiment of the present invention includes a method for imaging fluid flow and/or perfusion using spin labeling, the method comprising applying a first magnetic gradient sequence to a labeling region, applying a first pulsed radio frequency (RF) sequence to the labeling region to label the fluid, the first pulsed RF sequence comprising a first plurality of pulses wherein an amplitude envelope is non-zero, the first plurality of pulses each separated by a respective first plurality of intervals wherein the amplitude envelope is substantially zero, and acquiring at least one first signal emitted from an imaging region, the acquisition of the at least one first signal being performed-after a first delay interval after applying the first pulsed RF sequence.

Another embodiment of the present invention includes a magnetic resonance imaging apparatus adapted to perform fluid flow/perfusion imaging, the magnetic imaging apparatus comprising a first signal generator adapted to provide a first pulsed RF sequence comprising a first plurality of pulses wherein an amplitude envelope is non-zero, the first plurality of pulses each separated by a respective first plurality of intervals wherein the amplitude envelope is substantially zero, a second signal generator adapted to provide a first magnetic gradient sequence, at least one detector adapted to obtain signals emitted from an imaging region of the object of interest, and at least one controller coupled to the first signal generator, the second signal generator and the at least one detector, the at least one controller adapted to perform a labeling procedure by controlling the first signal generator and the second signal generator to simultaneously provide the first pulsed RF sequence and the first magnetic gradient sequence for a labeling interval, and controlling the at least one detector to obtain at least one first signal after a first delay interval after the first labeling interval.

Another embodiment according to the present invention relates to a method for conducting an MR fluid flow study. A first amplitude modulated magnetic field gradient and a first amplitude modulated RF irradiation are simultaneously applied, and continuously change for a first period of time a signal from said fluid before it flows into a region of interest. A first envelope for the amplitude modulation of the first RF irradiation includes a substantial time period having approximately zero amplitude, between first and second time periods of the first envelope having nonzero amplitude. First data is acquired for at least a portion of the region of interest. A second amplitude modulated magnetic field gradient and a second amplitude modulated RF irradiation are simultaneously applied, and continuously change for a second period of time a signal from said fluid before it flows into the region of interest. Second data is acquired for the at least a portion of the region of interest. Compensated fluid flow data is generated for the at least a portion of the region of interest. The fluid flow data is a function of at least the first data and the second data.

Another embodiment of the invention relates to a magnetic resonance imaging apparatus constructed and arranged to perform fluid flow imaging. The apparatus includes a first module that generates amplitude modulated labeling RF irradiation. A first envelope for the amplitude modulation of the first RF irradiation includes a substantial time period having approximately zero amplitude, between first and second time periods of the first envelope having nonzero amplitude. The apparatus also includes a second module that generates an amplitude modulated magnetic field gradient simultaneously to the generation of the amplitude modulated labeling RF irradiation by the first module.

DETAILED DESCRIPTION

As discussed above, blood flow and/or perfusion imaging may be performed via various spin labeling techniques. Image artifacts resulting from magnetization transfer effects may be addressed by using both labeling and control procedures. A number of suitable RF sequences for labeling and control procedures are described in U.S. Pat. No. 6,717,405 B2 ('405), entitled "ARTERIAL SPIN LABELING USING TIME VARYING GRADIENTS," which is herein incorporated by reference in its entirety. In particular, the '405 patent describes various magnetic gradient and RF sequences suitable for obtaining relatively high-sensitivity NMR data.

However, the RF sequences disclosed in the '405 application may not be capable of being implemented on commercially available magnetic resonance imaging apparatus and/or may deposit unnecessary amounts of RF energy into tissue being imaged. In particular, the '405 patent is directed to continuous arterial spin labeling (CASL), which typically requires near continuous RF transmit capabilities, as discussed in further detail below. Such capabilities are often unavailable on standard and/or commercially available MR imaging equipment. For example, some commercially available apparatus are not capable of continuously generating high power RF signals, which cause the RF amplifiers to overheat and/or otherwise cause the equipment to malfunction due to the generally continuous generation of RF power.

Applicant has appreciated that by using pulsed RF sequences, spin labeling may be performed using less RF power and generating less heat. The pulsed RF sequences may have two-fold effect: 1) the pulsed RF sequences may be capable of being generated by commercially available magnetic resonance equipment; and 2) the pulsed RF sequences may result in reduced power deposition in tissue for which blood flow/perfusion imaging is desired.

In one embodiment, blood flow/perfusion imaging is performed using a magnetic gradient sequence and a pulsed RF sequence, wherein the pulsed RF sequence comprises a train of pulses separated by intervals in which no signal is provided. During the intervals in which no signal is provided, the signal generators may cool off to reduce the likelihood that, for example, RF amplifiers or other equipment will overheat and/or malfunction. In addition, during the intervals that have no signal, RF power is not being deposited in tissue, thus providing safer imaging procedures.

Figure 1:
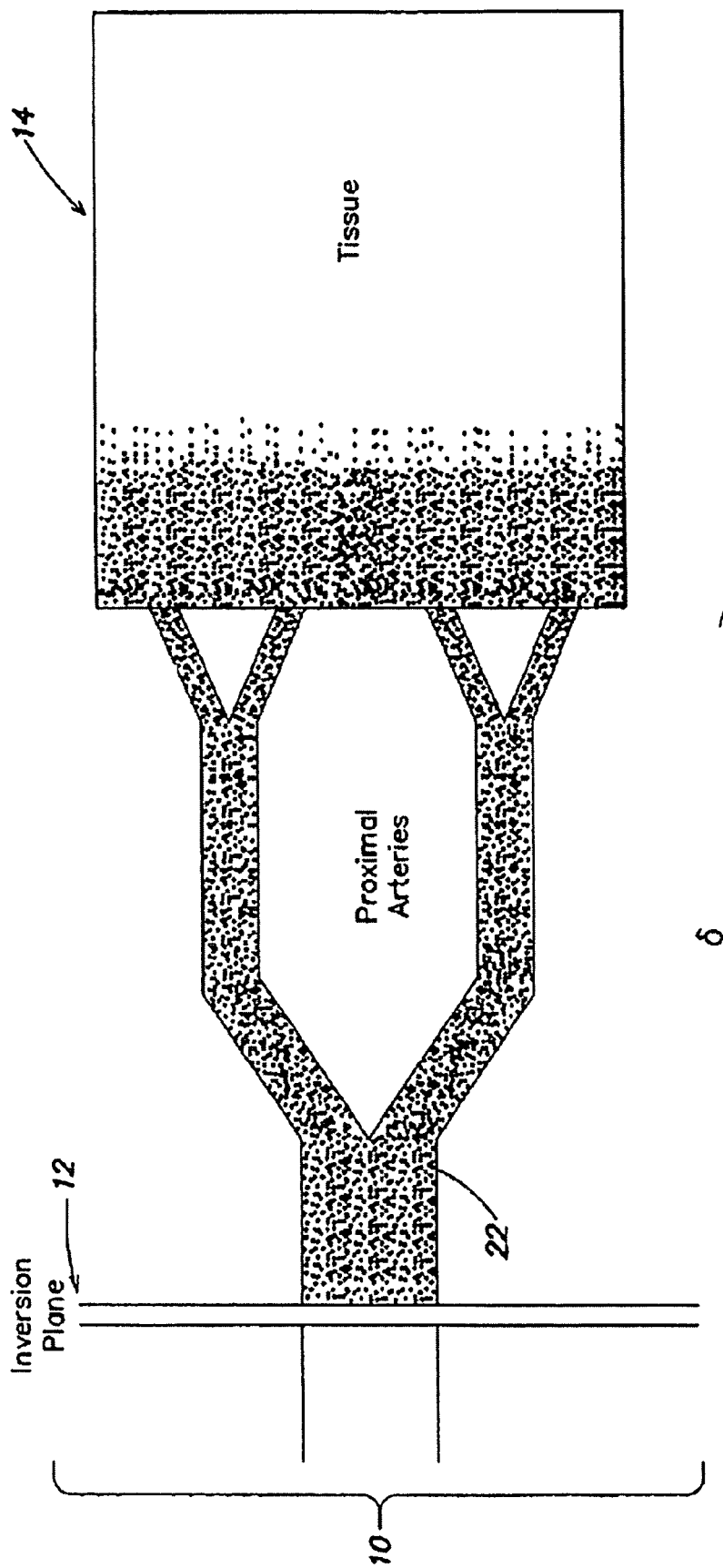
FIG. 1 illustrates a method of imaging blood flow/perfusion using a labeling and control procedure.

FIG. 1 illustrates one method of performing arterial spin labeling using both a labeling and a control procedure. During a labeling procedure, a magnetic field gradient (referred to as a magnetic gradient sequence or simply a gradient sequence) and an RF sequence adapted to invoke spin inversion are applied simultaneously at inversion plane 12 to label the blood flowing through an artery 22. As discussed above, the gradient sequence may be applied to both align the spins about a first precession axis and to localize the effect of the spin inversion. The RF sequence, in turn, may be applied to perturb the spins and cause them to precess about a second precession axis (e.g., an inversion axis). The labeled blood continues to flow through the proximal arteries and perfuses into tissue 14.

The labeling of the blood will slowly decay as the spins re-align with the first precession axis (i.e., as the spins recover from inversion), producing an NMR signal in the process. In particular, the labeled blood will relax according to material specific relaxation time T1 (spin lattice relaxation time) and T2 (spin relaxation time). These relaxation times, coupled with other known values, such as the speed of the blood flow, may be used to interpret the NMR signal detected at some time t after labeling. In addition to the spin inversion, the labeling procedure also induces generally unwanted magnetic transfer effects due, at least in part, to imperfect localization.

After the labeling sequence is performed, a control procedure may be performed to account for various magnetization transfer effects. The control procedure may be performed in the same plane 12, however, the control RF sequence may be formed and applied such that spin inversion is not invoked, while still producing the same or similar magnetization transfer effects and as in the labeling procedure. Images resulting from blood having undergone the labeling procedure and the control procedure may then be compared to, for example, subtract out magnetization transfer effects to reduce and/or eliminate associated image artifacts.

Figure 2:
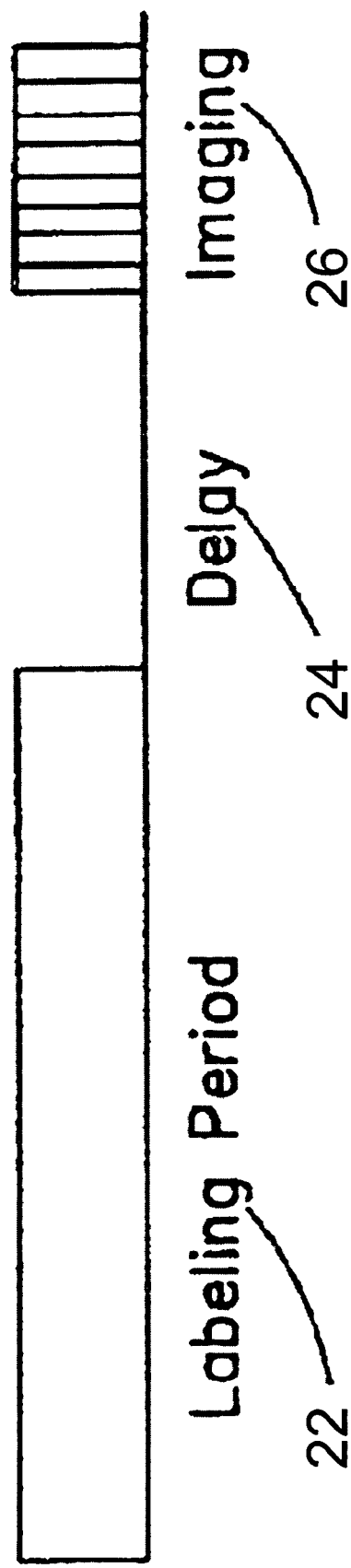
FIG. 2 illustrates a timing diagram for use in the method illustrated in FIG. 1.

The labeling and control procedures may be applied according to any number of timing schedules. For example, FIG. 2 illustrates one possible sequence timing diagram for spin labeling and image acquisition. During labeling period 22, a desired RF sequence adapted to invoke spin inversion is applied to a particular region, after which blood flows into the region of interest during delay 24, and imaging is performed during period 26. During period 26, one or more slices may be imaged. In an alternative embodiment, volume imaging may be performed and one or more volume images may be obtained. The term "imaging" refers to taking data sets (e.g., detecting NMR data) from the region of interest and then manipulating them as appropriate. For example, the NMR data may be reconstructed to form one or more images. The same or a similar timing diagram may be used for a control procedure to obtain information that may be used to compensate for various magnetization transfer effects. Various labeling and control procedures are described in further detail in the '405 patent.

Figure 3A:
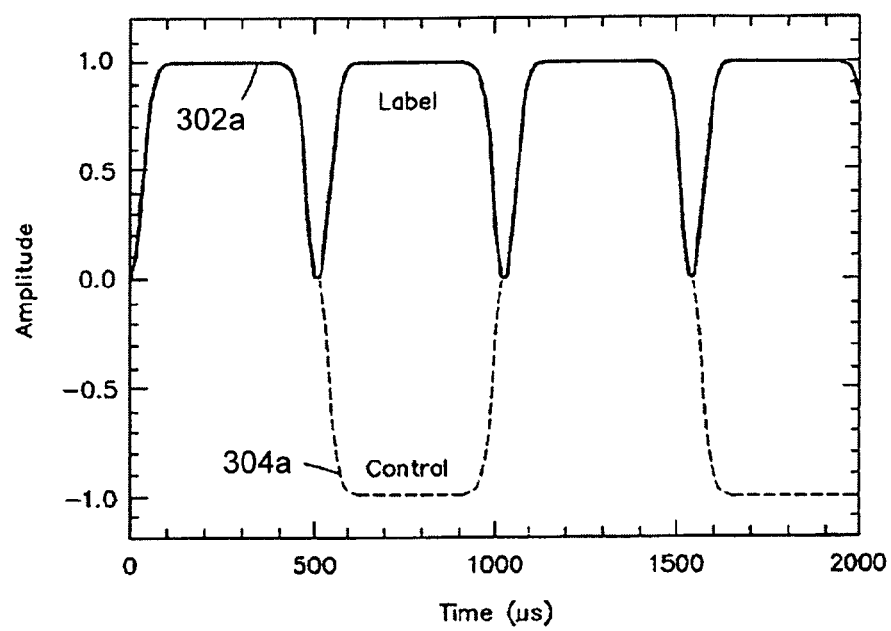
FIGS. 3A and 3B illustrate conventional waveforms characterizing RF sequences.
Figure 3B:
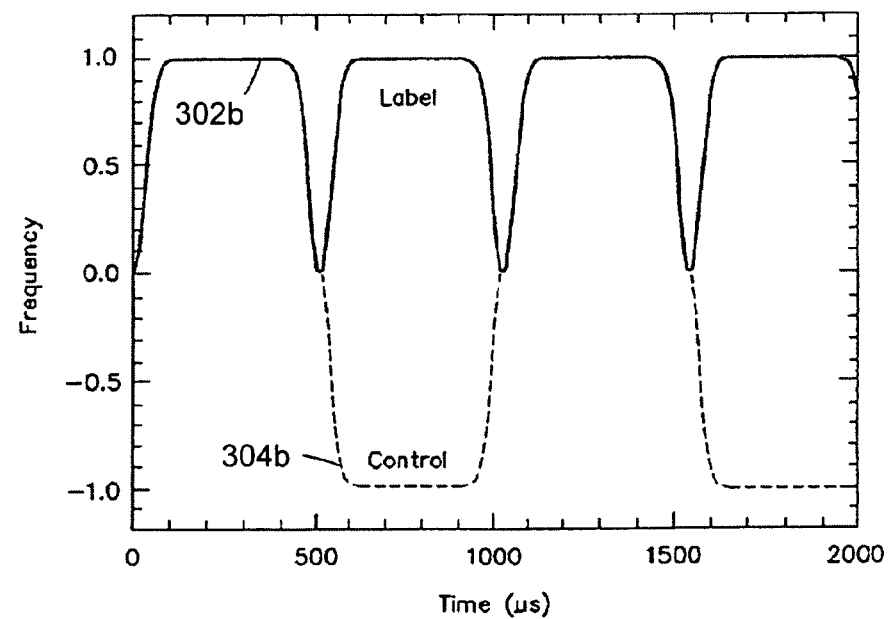

The '405 patent describes various RF sequences suitable for performing spin labeling to image blood flow/perfusion. For example, FIGS. 3A and 3B illustrate amplitude modulated envelopes for RF sequences used in both the labeling and control procedures as generally described in the '405 patent. The term "envelope" is used herein to refer to a function or a curve description according to which a particular parameter may be modulated. It should be appreciated that the magnetic gradient fields and RF fields have an associated frequency. In particular, the gradient fields and the RF fields may be oscillating between two amplitude extremes. The envelopes, therefore, illustrate how the amplitude extreme changes as a function of time, thus characterizing the amplitude modulation of the corresponding sequences.

FIG. 3A illustrates waveforms characterizing the amplitude envelopes of RF sequences for labeling and control procedures, respectively. The control envelope 304a is illustrated as a dotted line where it deviates from the labeling envelope 302a. Control envelope 304a is a continuously varying periodic function approximating a square wave. Labeling envelope 302a is illustrated as the absolute value of the control envelope 304a. RF sequences that are amplitude modulated according to labeling envelope 302a are capable of invoking spin inversion. By contrast, RF sequences that are amplitude modulated according to labeling envelope 304a generally will not invoke spin inversion but will induce various other magnetization transfer effects also caused by the labeling envelope 302a.

FIG. 3B illustrates waveforms characterizing the frequency envelopes of RF sequences for both labeling and control procedures. As discussed above, the gradient and RF sequences may be oscillating at respective frequencies, which may change over time according to the envelopes illustrated in FIG. 3B. Labeling envelope 302b corresponds to the frequency modulation waveform for a labeling RF sequence, and labeling envelope 304b corresponds to the frequency modulation waveform for a control RF sequence.

Applicant has appreciated that the envelope waveforms illustrated in FIG. 3A and 3B have a number of drawbacks. In particular, the waveforms are substantially continuous. Applying such waveforms requires constant RF power generation, which can be difficult if not impossible to achieve in currently available magnetic resonance imaging equipment. For example, the constant RF power generation may cause the RF power amplifier in commercially available apparatus to overheat. Accordingly, the waveforms are not readily applicable in imaging apparatus currently available and deployed, and are therefore of relatively limited use.

In addition, the constant RF power generation has a corresponding constant deposition of RF energy into the object being imaged. Thus, RF power not needed to invoke spin inversion may be unnecessarily deposited into tissue. Finally, Applicant has appreciated that gradient and/or RF sequences may not need to be frequency modulated, thus simplifying the generation of the appropriate waveforms.

Applicant has appreciated that pulsed RF sequences may permit standard and/or commercially available equipment (e.g., RF signal generators in commercially available MR imaging equipment) to be used to generate the RF sequences. For example, many currently available MRI imagers may be capable of generating pulsed RF sequences without risk (or a with a minimal risk) of overheating the equipment, or causing the equipment to otherwise malfunction, as described in further detail below.

The term "pulsed" refers to signals that are generated periodically or pseudo-periodically having intervals of zero or substantially zero amplitude (e.g., the period includes intervals wherein no or substantially no signal is provided). For example, a pulsed sequence may be a sequence wherein a signal is alternately generated and turned off. Accordingly, a pulsed RF sequence may allow an RF generation module to "rest" between periods of generating the RF signals (i.e., during intervals of zero or substantially zero amplitude signal), which may allow an RF amplifier sufficient time to cool in between pulses to prevent overheating.

Following below are more detailed descriptions of various concepts related to, and embodiments of, methods and apparatus according to the present invention. It should be appreciated that various aspects of the invention described herein may be implemented in any of numerous ways. Examples of specific implementations are provided herein for illustrative purposes only. In addition, the various aspects of the invention described in the embodiments below may be used alone or in any combination, and are not limited to the combinations explicitly described herein.

Figure 4:
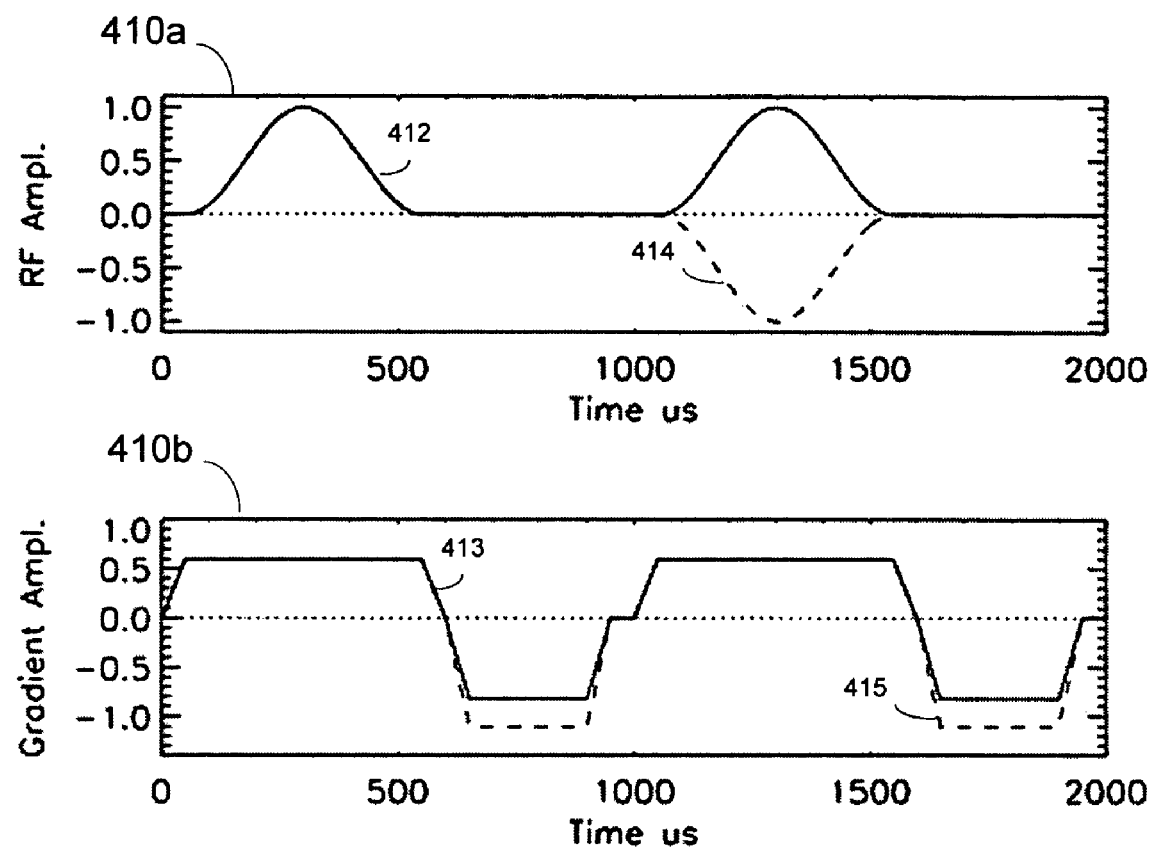
FIG. 4 illustrates waveforms characterizing gradient and pulsed RF sequences, in accordance with one embodiment of the present invention.

FIG. 4 illustrates waveforms for use in a spin labeling procedure, in accordance with one embodiment of the present invention. Sequences 410a illustrate waveforms characterizing the amplitude envelopes of RF pulses for a labeling and a control procedure, respectively. The control waveform is illustrated by a dotted line whenever it deviates from the labeling waveform. In particular, waveform 412 illustrates the envelope for a labeling RF pulse sequence. The envelope for the labeling pulsed RF sequence is comprised of a train of pulses separated by intervals in which the amplitude is zero or substantially zero (e.g., where no RF signal is being generated). Waveform 412, when applied to the amplitude envelope of a pulsed RF sequence (in combination with an appropriate gradient sequence), is capable of invoking spin inversion in a region of interest to which the sequence is applied. However, due at least in part to the imprecision of the localization provided by the gradient sequence (described below), various magnetization transfer effects may also be induced.

Waveform 414 illustrates the envelope for a control pulsed RF sequence. Like the labeling pulsed RF sequence, the control pulsed RF sequence is comprised of a train of pulses separated by zero amplitude intervals (or near zero amplitudes). However, in the control sequence, the non-zero pulses are alternatively positive and negative. The alternating pulses are applied to ensure that spin inversion does not occur. However, while spin inversion is not invoked, the similarity between the labeling and control sequences is such that at least some of the magnetic transfer effects resulting from the labeling sequence will also occur during application of the control sequence.

As discussed above, the interval between pulses may permit the RF generators an opportunity to cool down to avoid overheating, or preventing other components from malfunctioning as a result of generally continuous RF power generation. In addition, zero amplitude intervals between pulses do not deposit any RF power into tissue, thus reducing the RF dose received by a patient. The reduction in generated RF power is a function of the duty cycle of the amplitude envelopes. The term duty cycle with respect to the envelope of RF pulse sequences refers herein to the percentage of time during a pulse sequence that RF power is being generated (e.g., the ratio of the length of a pulse to the period of the sequence), or the proportion of time that an RF generator is outputting a signal. For example, non-zero amplitude intervals may be considered an ON state, and substantially zero amplitude intervals may be considered an OFF state, wherein the ratio of time in the ON state with respect to the total time in the ON and OFF state is indicative of the duty-cycle.

In FIG. 4, the duty cycle of the pulse sequence envelopes is approximately 0.5. That is, the length of the interval between pulses is approximately equal to the length of the pulse (e.g., the zero and non-zero amplitude intervals are approximately equal). However, other duty cycles for the labeling and control envelopes may be used, as the aspects of the invention are not limited in this respect. In particular, using a lower duty cycle may reduce the average amount of RF power that needs to be generated, and thus may reduce both equipment heating effects and tissue power deposition. Thus, the duty cycle may be chosen appropriately for the particular equipment on which the RF pulse sequences are to be generated and/or in view of desired levels of RF power deposition.

While it may be preferable to use the same or substantially the same duty cycle for both the labeling and control envelopes to replicate as closely as possible, for example, the same magnetization transfer effects in both the labeling and control procedures, the aspects of the invention are not so limited. In particular, the duty cycle for the envelope of the labeling RF pulse sequence may be different than the duty cycle for the envelope of the control RF pulse sequence. It should also be appreciated that the waveform for the labeling and control envelopes illustrated in FIG. 4 are merely exemplary. For example, the waveforms may be square pulses, triangular pulses, sawtooth pulses, etc., as the aspects of the invention are not limited in this respect. In addition, the labeling and control waveforms need not be of the same shape, as the aspects of the invention are not limited in this respect.

Sequences 410b illustrate waveforms characterizing the amplitude envelopes of magnetic gradient sequences for a labeling and a control procedure, respectively. The control waveform is illustrated by a dotted line whenever it deviates from the labeling waveform. In conventional sequences, the amplitude envelope of the gradient sequence was typically constant. Applicant has appreciated that by providing a time-varying amplitude envelope, the localization of labeling to a desired region may be improved, and more particularly, magnetization transfer effects may be reduced. Accordingly, waveform 413 is an oscillating square wave with dissimilarly shaped half-periods. Waveform 415 is similar but has a different discongruity of the half-periods. The average of the waveforms may be used to control various aspects of the labeling and control procedures, as discussed in further detail below.

In the gradient and pulsed RF sequences described above, the frequency of signals (i.e., the rate at which the signal oscillates under the envelope) may be constant, rather than varied as performed in conventional sequences (e.g., as described above in connection with FIG. 3B). By providing constant frequency signals in place of frequency modulated signals, the complexity of signal generation is thereby reduced. It should be appreciated, though, that the gradient and pulsed RF sequences may be frequency modulated if desired, as the aspects of the invention are not limited in this respect.

Figure 5:
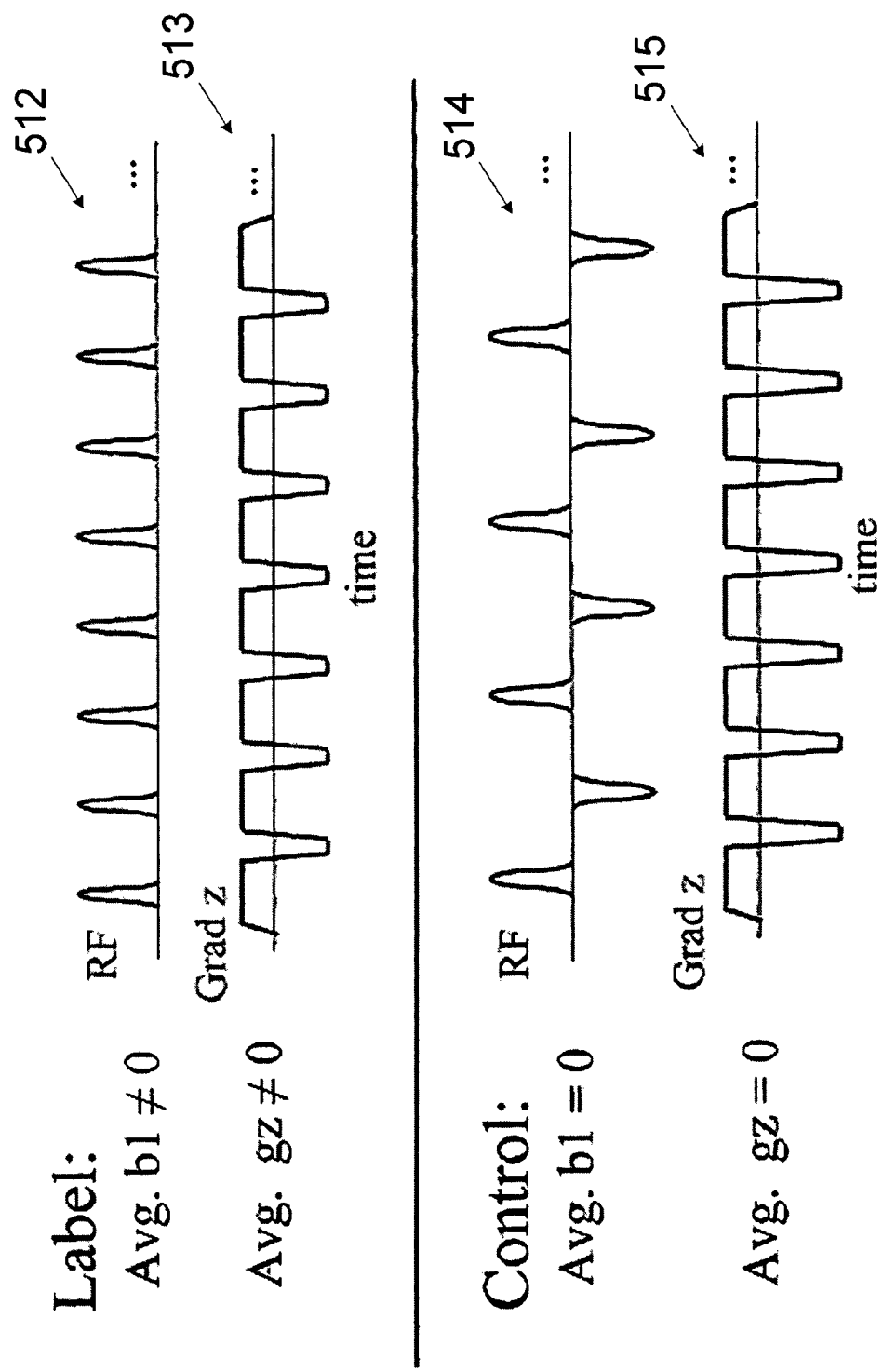
FIG. 5 illustrates waveforms characterizing magnetic gradient and pulsed RF sequences for a labeling and a control procedure respectively, in accordance with one embodiment of the present invention.

FIG. 5 illustrates waveforms for labeling and control procedures, in accordance with another embodiment of the present invention. A labeling procedure, for example, may include applying, simultaneously, an RF pulse sequence having an amplitude envelope characterized by waveform 512 with a magnetic gradient sequence having an amplitude envelope characterized by waveform 513 to induce spin inversion on a region of tissue. The waveforms illustrated in FIG. 5 may be similar to the waveforms illustrated in FIG. 4. However, in contrast to the waveform for the pulsed RF sequences illustrated in FIG. 4, waveform 512 has a duty cycle less than 0.5. Accordingly, the pulsed RF sequences having an amplitude envelope characterized by waveform 512 have increased zero-amplitude intervals, allowing additional time for generator components to cool off, and further reducing the RF power deposition into the tissue.

Waveform 513 may be similar to the waveform 413 illustrated in FIG. 4, and is characterized by a non-zero average amplitude (the integral of the envelope of the gradient sequence over any period or integer number of periods is non-zero). The time-varying amplitude envelope of the gradient sequence may assist in localizing the effects of labeling. While waveform 513 is shown as having a non-zero average, it should be appreciated that waveform 513 may have an average that is equal or substantially equal to zero (e.g., having equal or substantially equal half-periods), as the aspects of the invention are not limited in this respect. When a gradient and a pulsed RF sequence having amplitude envelopes characterized by waveforms 512 and 513 are applied simultaneously, spin inversion is invoked in tissue exposed to the waveforms. Despite the increased localization provided by amplitude modulating the gradient sequence, however, some magnetization transfer effects still occur.

A control procedure may be used to compensate for magnetization transfer effects. The control procedure, for example, may include applying a pulsed RF sequence having an envelope characterized by waveform 514 simultaneously with a gradient sequence having an envelope characterized by the waveform 515, to induce one or more of the magnetization transfer effects resulting from the labeling procedure, but without causing spin inversion. As in FIG. 4, the amplitude envelope for the control RF pulse sequence (e.g., waveform 514) is substantially the same as the envelope for the labeling RF pulse sequence (e.g., waveform 512) except that every other pulse is inverted. In addition, waveform 515 is different from waveform 513 in that the average value (or integral) of the waveform is substantially zero. In particular, waveform 515 has an average value or integral over a period or integer number of periods that is equal or substantially equal to zero.

Figure 6:
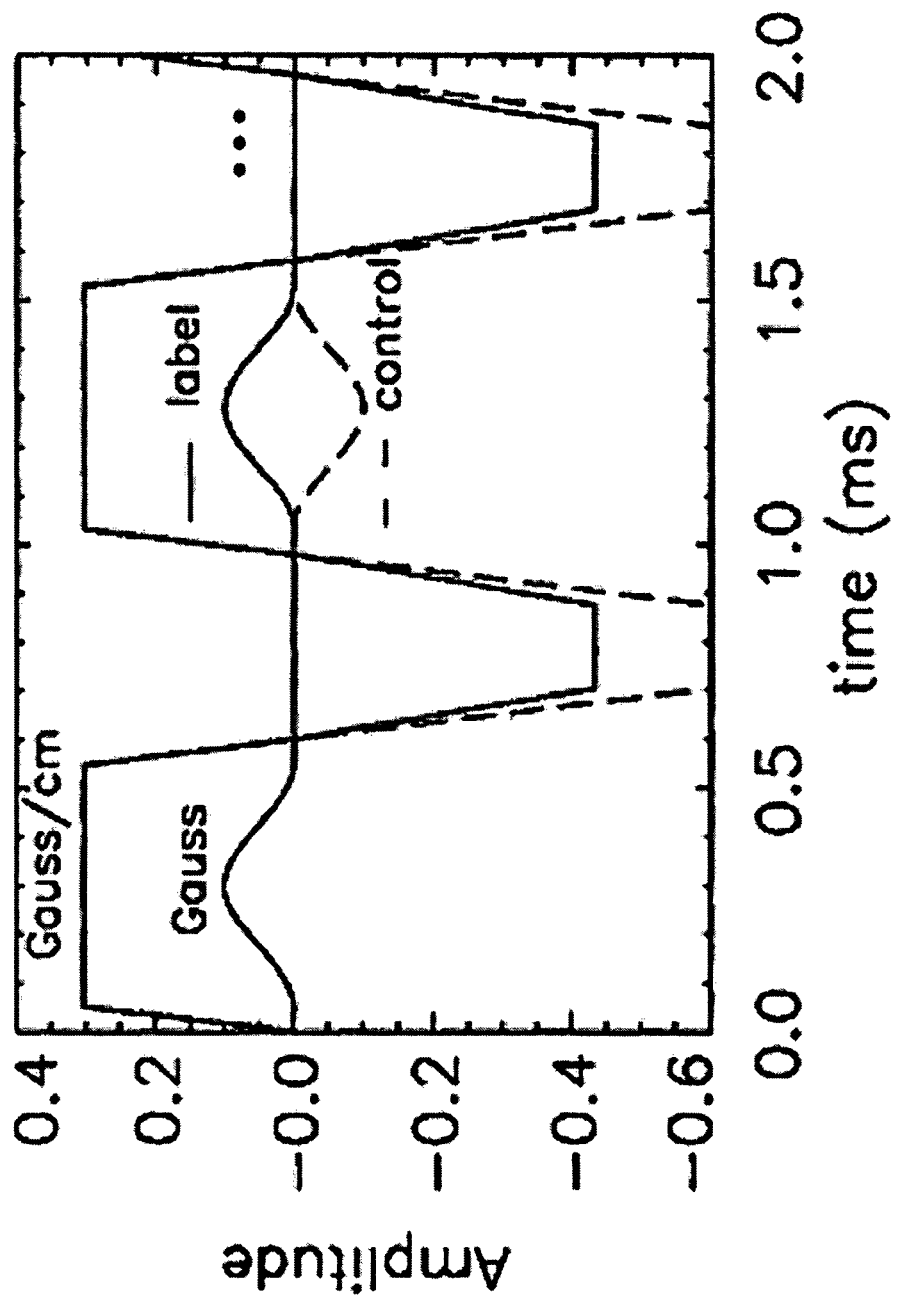
FIG. 6 illustrates waveforms characterizing magnetic gradient and pulsed RF sequences for a labeling and a control procedure shown on the same plot, in accordance with one embodiment of the present invention.

When applied simultaneously to a region of tissue, a gradient sequence having an amplitude envelope characterized by waveform 515 and a pulsed RF sequence having an amplitude envelope characterized by waveform 513, the region of tissue undergoes similar magnetization transfer effects as in the labeling procedure without undergoing spin inversion. Thus NMR data detected after the labeling procedure and control procedure may be compared to remove magnetization transfer effects, as described in further detail below. FIG. 6 illustrates the waveforms characterizing amplitude envelopes for gradient and pulsed RF sequences for both labeling and control procedures illustrated on a single graph to illustrate timing and scale, in accordance with one embodiment of the present invention.

Figure 7:
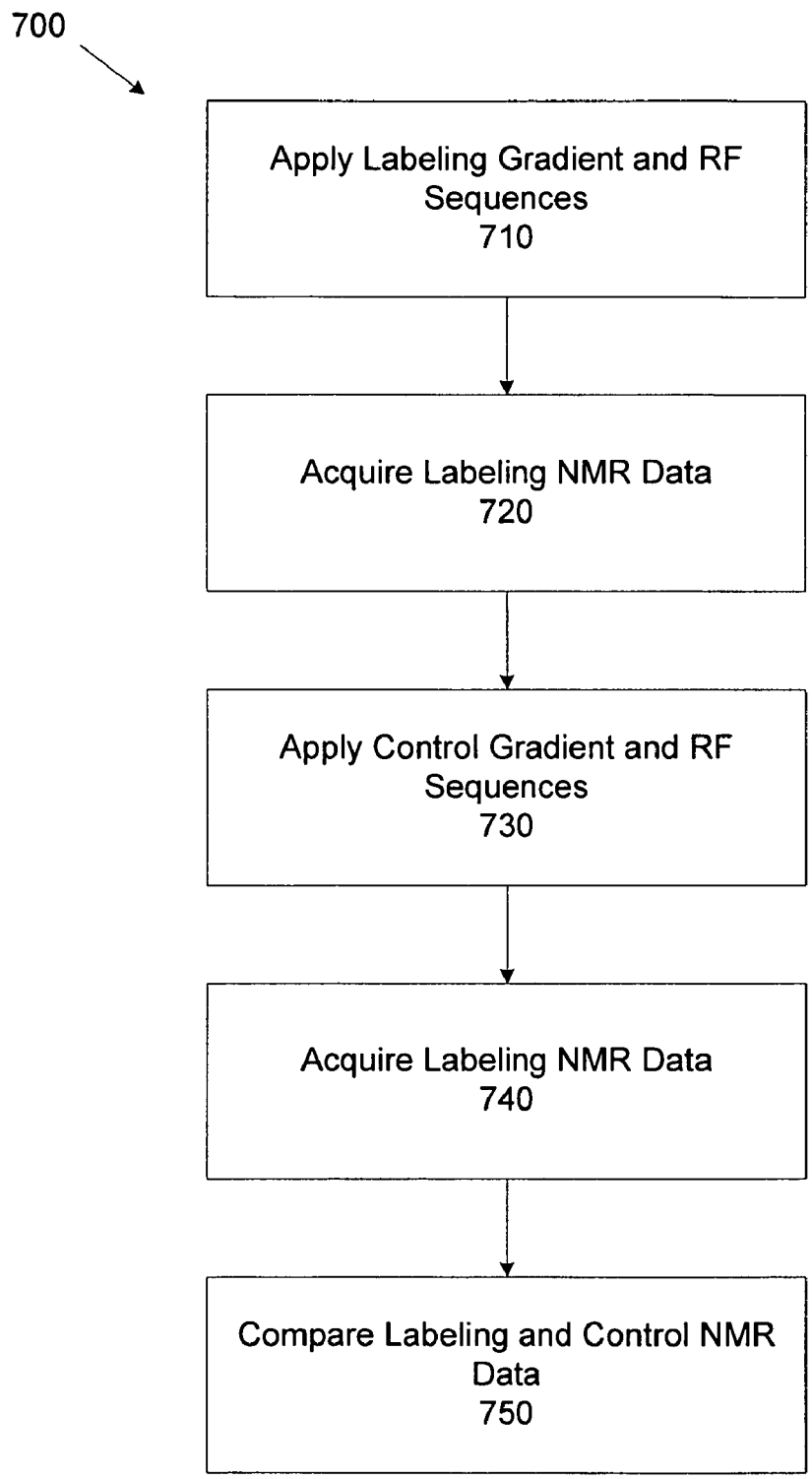
FIG. 7 illustrates a method of blood flow/perfusion imaging using a labeling and control procedure, in accordance with one embodiment of the present invention.

FIG. 7 illustrates a method of using labeling and control pulsed RF sequences to perform blood flow imaging, in accordance with one embodiment of the present invention. In particular, method 700 may be used with any of the various gradient and pulse RF sequences described herein. In act 710, a labeling gradient and pulsed RF sequence is applied to a labeling region, for example, to the inversion plane 12 illustrated in FIG. 1. The gradient and pulsed RF sequences are adapted to invoke spin inversion in the water molecules of blood flowing through the inversion plane during the interval in which the gradient and pulsed RF sequences are applied. Despite the localization effects of the labeling gradient, some magnetization transfer effects may occur.

In one embodiment, 500 μsec Hanning window shaped pulses are used for the pulsed RF sequence (e.g., as illustrated in FIG. 4), a gradient amplitude of 0.6 G, an average B1 of 20 mG, an average gradient of 0.15 G and a labeling interval (i.e., the duration in which the gradient and RF sequences are generated) of 1.5 seconds are used as the operating parameters for the labeling procedure. It should be appreciated that any of the gradient and pulsed RF sequences described herein may be applied, using any combination of field strengths, operating parameters, etc., as the aspects of the invention are not limited in this respect. In one embodiment, the amplitude modulation (e.g., the pulse frequency) of the labeling RF sequence is fast compared to T2, in order to avoid decreases in efficiency due to transversal relaxation. However, any pulse frequency may be used.

In act 720, after some predetermined delay (e.g., delay 34 illustrated in FIG. 2), NMR signals emitted from an imaging region are detected, for example, using any number and variety of detectors, such as one or more RF coils sensitive to electro-magnetic field changes caused by the NMR phenomenon. In one embodiment, the post-labeling delay is 1.2 seconds, however, any delay may be used to allow the labeled atoms to reach the imaging region in view of the various relaxation times. In one embodiment, NMR signals are detected in multiple slices, although a single slice may be imaged for each labeling procedure.

In act 730, control gradient and pulsed RF sequences are applied to the labeling region. The control gradient and pulsed RF sequences are adapted to cause, as close as possible, the same magnetic transfer effects as resulted from applying the labeling sequences to the labeling region. However, the control sequences are designed to not invoke spin conversion in the blood flowing through the inversion plane. Any of the control sequences described herein may be used to perform the control procedure. In act 740, after the same predetermined delay used in the labeling procedure, NMR signals emitted from the imaging region are detected.

In act 750, the NMR data obtained during the labeling and control procedures may be compared to remove at least some of the magnetization transfer effects. In one embodiment, the NMR data obtained from the control procedure is subtracted from the NMR data obtained during the labeling procedure, and the resulting NMR data is reconstructed to form an image. In another embodiment, each of the NMR data obtained during the labeling procedure and the NMR data obtained during the control procedure are separately reconstructed to form a labeling image and a control image. The control image may then be subtracted from the labeling image to remove at least some of the image artifacts resulting from magnetization transfer effects. The NMR signals and/or images obtained from labeling and control procedures may be compared in any way to modify the labeling NMR signals and/or labeling images to remove unwanted magnetization transfer effects, as the aspects of the invention are not limited in this respect.

In some embodiments, addition residual errors may be corrected for by labeling of spins to a region downstream to the imaging region. In such a downstream labeling procedure, however, no actual tissue perfusion is detected, because there may be no blood flow from the downstream region to the region of interest. Likewise, a control procedure may be performed on the downstream region. Theoretically, in case of downstream imaging, labeling and control datasets should be nearly identical. However, in actual implementations that may be not the case due to residual and systematic errors. When labeling images are subtracted from control images, a small residual signal may still be present. If desired, the data indicative of residual or systematic errors may be subtracted from the perfusion image resulting from subtraction of labeling and control images obtained from the upstream labeling and control procedures to further correct for errors.

Figure 8:
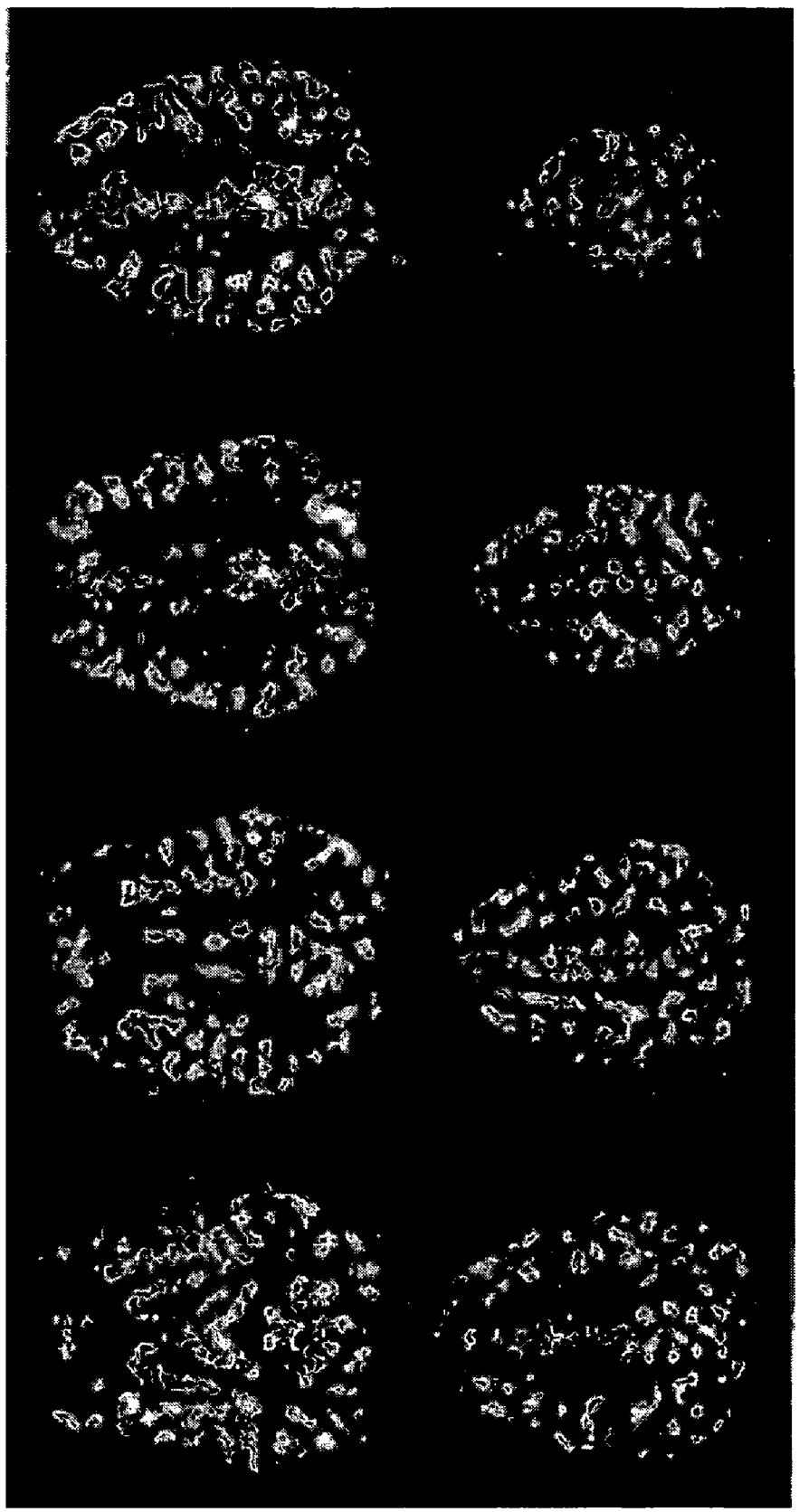
FIG. 8 is an illustration of in-vivo perfusion image achieved using one or more aspects of the present invention.

FIG. 8 shows examples of perfusion images acquired using a method according to one embodiment of the invention, using RF modulation envelopes and gradient modulation envelopes having a period of 800 µs. Labeling, control and imaging procedure were performed on a General Electric (GE) 3 Tesla scanner. A 500 µs Hanning window shaped pulses were used for the pulsed RF sequences. It should be appreciated that the GE 3 Tesla scanner is a commercially available imaging apparatus capable of generating the pulsed RF sequences without overheating or otherwise malfunctioning. Likewise, as discussed above, the pulsed RF sequences may be appropriate for other standard and/or commercially available MRI imaging equipment, and the aspects of the invention are not limited for use on any particular type or brand of MRI imaging apparatus.

The present invention is not limited to a particular implementation of the apparatus or dataset reconstruction system. It may be implemented on a variety of scanners and other MR equipment. Aspects of the present invention may also be used for magnetic resonance angiography, the selective imaging of blood vessels by MRI and/or used in measurement of flow in pipes or porous media and in a variety of other applications.

A computer system for implementing an MR apparatus control and/or imaging system as a computer program typically includes a main unit connected to both an output device which displays information to a user and an input device which receives input from a user. The main unit generally includes a processor connected to a memory system via an interconnection mechanism. The input device and output device also are connected to the processor and memory system via the interconnection mechanism.

It should be understood that one or more output devices may be connected to the computer system. Example output devices include a cathode ray tube (CRT) display, liquid crystal displays (LCD), printers, communication devices such as a modem, and audio output. It should also be understood that one or more input devices may be connected to the computer system. Example input devices include a keyboard, keypad, track ball, mouse, pen and tablet, communication device, and data input devices such as sensors. It should be understood the invention is not limited to the particular input or output devices used in combination with the computer system or to those described herein.

The computer system may be a general purpose computer system which is programmable using a computer programming language. The computer system may also include specially programmed, special purpose hardware. In a general purpose computer system, the processor is typically a commercially available processor. Such a microprocessor executes a program called an operating system, which controls the execution of other computer programs and provides scheduling, debugging, input/output control, accounting, compilation, storage assignment, data management and memory management, and communication control and related services. The processor and operating system define a computer platform for which application programs in high-level programming languages are written.

A memory system typically includes a computer readable and writeable nonvolatile recording medium, of which a magnetic disk, a flash memory and tape are examples. The disk may be removable, known as a floppy disk, or permanent, known as a hard drive. A disk has a number of tracks in which signals are stored, typically in binary form, i.e., a form interpreted as a sequence of one and zeros. Such signals may define an application program to be executed by the microprocessor, or information stored on the disk to be processed by the application program. Typically, in operation, the processor causes data to be read from the nonvolatile recording medium into an integrated circuit memory element, which is typically a volatile, random access memory such as a dynamic random access memory (DRAM) or static memory (SRAM). The integrated circuit memory element allows for faster access to the information by the processor than does the disk. The processor generally manipulates the data within the integrated circuit memory and then copies the data to the disk when processing is completed. A variety of mechanisms are known for managing data movement between the disk and the integrated circuit memory element, and the invention is not limited thereto. It should also be understood that the invention is not limited to a particular memory system.

It should be understood the invention is not limited to a particular computer platform, particular processor, or particular high-level programming language. Additionally, the computer system may be a multiprocessor computer system or may include multiple computers connected over a computer network. It should be understood that each module may be separate modules of a computer program, or may be separate computer programs. Such modules may be operable on separate computers. Data may be stored in a memory system or transmitted between computer systems. The invention is not limited to any particular implementation using software or hardware or firmware, or any combination thereof. The various elements of the system, either individually or in combination, may be implemented as a computer program product tangibly embodied in a machine-readable storage device for execution by a computer processor. Various steps of the process may be performed by a computer processor executing a program tangibly embodied on a computer-readable medium to perform functions by operating on input and generating output. Computer programming languages suitable for implementing such a system include procedural programming languages, object-oriented programming languages, and combinations of the two.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. The invention is capable of other embodiments and of being practiced or of being carried out in various ways. In particular, the various gradient and RF sequences, using any variety of operating parameters, may be used in any combination, as the aspects of the invention are not limited to the specific combinations described herein. Accordingly, the foregoing description and drawings are by way of example only.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

What is claimed is:

1. A method for imaging fluid flow and/or perfusion using spin labeling, the method comprising:
   applying a first magnetic gradient sequence to a labeling region;
   applying a first pulsed radio frequency (RF) sequence to the labeling region continuously to label the fluid, the first pulsed RF sequence comprising a first plurality of pulses wherein an amplitude envelope is non-zero, the first plurality of pulses comprising at least five pulses, the first plurality of pulses each separated by a respective first plurality of intervals wherein the amplitude envelope is substantially zero; and
   acquiring at least one first signal emitted from an imaging region, the acquisition of the at least one first signal being performed after a first delay interval after applying the first pulsed RF sequence.

2. The method of claim 1, further comprising:
   applying a second magnetic gradient sequence to the labeling region;
   applying a second pulsed RF sequence to the labeling region, the second pulsed RF sequence comprising a second plurality of pulses wherein an amplitude envelope is non-zero, the second plurality of pulses comprising at least five pulses, the second plurality of pulses separated by a respective second plurality of intervals wherein the amplitude envelope is substantially zero; and
   acquiring at least one second signal from emitted from the imaging region, the acquisition of the at least one second signal being performed after a second delay interval after applying the second pulsed RF sequence.

3. The method of claim 2, wherein applying the first magnetic gradient sequence and applying the first pulsed RF sequence are performed as part of a labeling procedure adapted to invoke spin inversion in the labeling region, and wherein the acts of applying the second magnetic gradient sequence and applying the second pulsed RF sequence are performed as part of a control procedure that is adapted to invoke substantially no spin inversion in the labeling region.

4. The method of claim 3, wherein the amplitude envelope of each of the second plurality of pulses is inverted with respect to a previous pulse in the second pulsed RF sequence, and wherein the first plurality of pulses each have an amplitude envelope that is an absolute value of the amplitude envelopes of the second plurality of pulses.

5. The method of claim 3, wherein the first magnetic gradient sequence has a first substantially periodic time-varying amplitude envelope, and wherein the second magnetic gradient sequence has a second substantially periodic time-varying envelope.

6. The method of claim 5, wherein the integral of the second substantially periodic time-varying amplitude envelope over a period is substantially zero, and wherein the integral of the first substantially periodic time-varying amplitude envelope over a period is non-zero.

7. The method of claim 3, wherein a length of each of the first plurality of pulses is substantially equal to a length of each of the first plurality of intervals.

8. The method of claim 3, wherein a length of each of the first plurality of pulses is less than a length of each of the first plurality of intervals.

9. The method of claim 3, wherein the at least one first signal and the at least one second signal include first nuclear magnetic resonance (NMR) data and second NMR data obtained from the imaging region as part of the labeling procedure and the control procedure, respectively, the method further comprising:
   reconstructing at least one first image from the first NMR data; and
   reconstructing at least one second image from the second NMR data.

10. The method of claim 9, further comprising modifying the at least one first image based on the at least one second image.

11. A magnetic resonance imaging apparatus adapted to perform fluid flow/perfusion imaging, the magnetic resonance imaging apparatus comprising:
    a first signal generator adapted to provide a first pulsed RF sequence continuously, the first pulsed RF sequence comprising a first plurality of pulses wherein an amplitude envelope is non-zero, the first plurality of pulses comprising at least five pulses, the first plurality of pulses each separated by a respective first plurality of intervals wherein the amplitude envelope is substantially zero;
    a second signal generator adapted to provide a first magnetic gradient sequence;
    at least one detector adapted to obtain signals emitted from an imaging region of an object of interest;
    at least one controller coupled to the first signal generator, the second signal generator and the at least one detector, the at least one controller adapted to perform a labeling procedure by controlling the first signal generator and the second signal generator to simultaneously provide the first pulsed RF sequence and the first magnetic gradient sequence for a labeling interval, and controlling the at least one detector to obtain at least one first signal after a first delay interval after the first labeling interval.

12. The apparatus of claim 11, wherein:
    the first signal generator is adapted to provide a second pulsed RF sequence continuously, the second pulsed RF sequence comprising a second plurality of pulses wherein an amplitude envelope is non-zero, the second plurality of pulses comprising at least five pulses, the second plurality of pulses each separated by a respective second plurality of intervals wherein the amplitude envelope is substantially zero,
    the second signal generator is adapted to provide a second magnetic gradient sequence; and
    the at least one controller is adapted to perform a control procedure by controlling the first signal generator and the second signal generator to simultaneously provide the second pulsed RF sequence and the second magnetic gradient sequence for a control interval, and controlling the at least one detector to obtain at least one second signal after a second delay interval after the control interval.

13. The apparatus of claim 12, wherein the controller is adapted to perform the control procedure after performing the labeling procedure, and wherein the labeling procedure is configured to cause spin inversion in fluid exposed to the labeling procedure, and the control procedure is configured to cause substantially no spin inversion in fluid exposed to the control procedure.

14. The apparatus of claim 13, wherein the first signal generator produces substantially no RF power during the first plurality of intervals and the second plurality of intervals.

15. The apparatus of claim 13, wherein a duty cycle of the first signal generator is less than approximately 0.5 during the labeling interval, and a duty cycle of the first signal generator is less than approximately 0.5 during the control interval.

16. The apparatus of claim 13, wherein the first magnetic gradient sequence has a first substantially periodic time-varying amplitude envelope and the second magnetic gradient sequence has a second substantially periodic time-varying amplitude envelope.

17. The apparatus of claim 16, wherein an integral of the second substantially periodic time-varying amplitude envelope over a period is substantially equal to zero, and wherein an integral of the first substantially periodic time-varying amplitude envelope over a period is non-zero.

18. The apparatus of claim 13, wherein the first signal generator includes at least one RF amplifier coupled to at least one RF coil, and wherein the at least one detector includes at least one RF coil.

19. The apparatus of claim 13, wherein the at least one first signal includes first nuclear magnetic resonance (NMR) data and the at least one second signal includes second NMR data, the apparatus further comprising at least one processor to receive the first NMR data and the second NMR data and to reconstruct at least one first image from the first NMR data and at least one second image from the second NMR data.

20. The apparatus of claim 19, wherein the at least one processor is configured to modify the at least one first image based on the at least one second image.

* * * * *